Nov. 23, 1965 J. R. KOBBE ET AL 3,219,801

PULSE COUNTER

Filed Aug. 25, 1961

INVENTORS
JOHN R. KOBBE
SAMUAL R. McCUTCHEON

BY

BUCKHORN, CHEATHAM & BLORE
ATTORNEYS

United States Patent Office 3,219,801
Patented Nov. 23, 1965

3,219,801

PULSE COUNTER

John R. Kobbe, Beaverton, and Samuel R. McCutcheon, Aloha, Oreg., assignors to Tektronix, Inc., Beaverton, Oreg., a corporation of Oregon Filed Aug. 25, 1961, Ser. No. 133,813
11 Claims. (Cl. 235—92)

Figure 1:
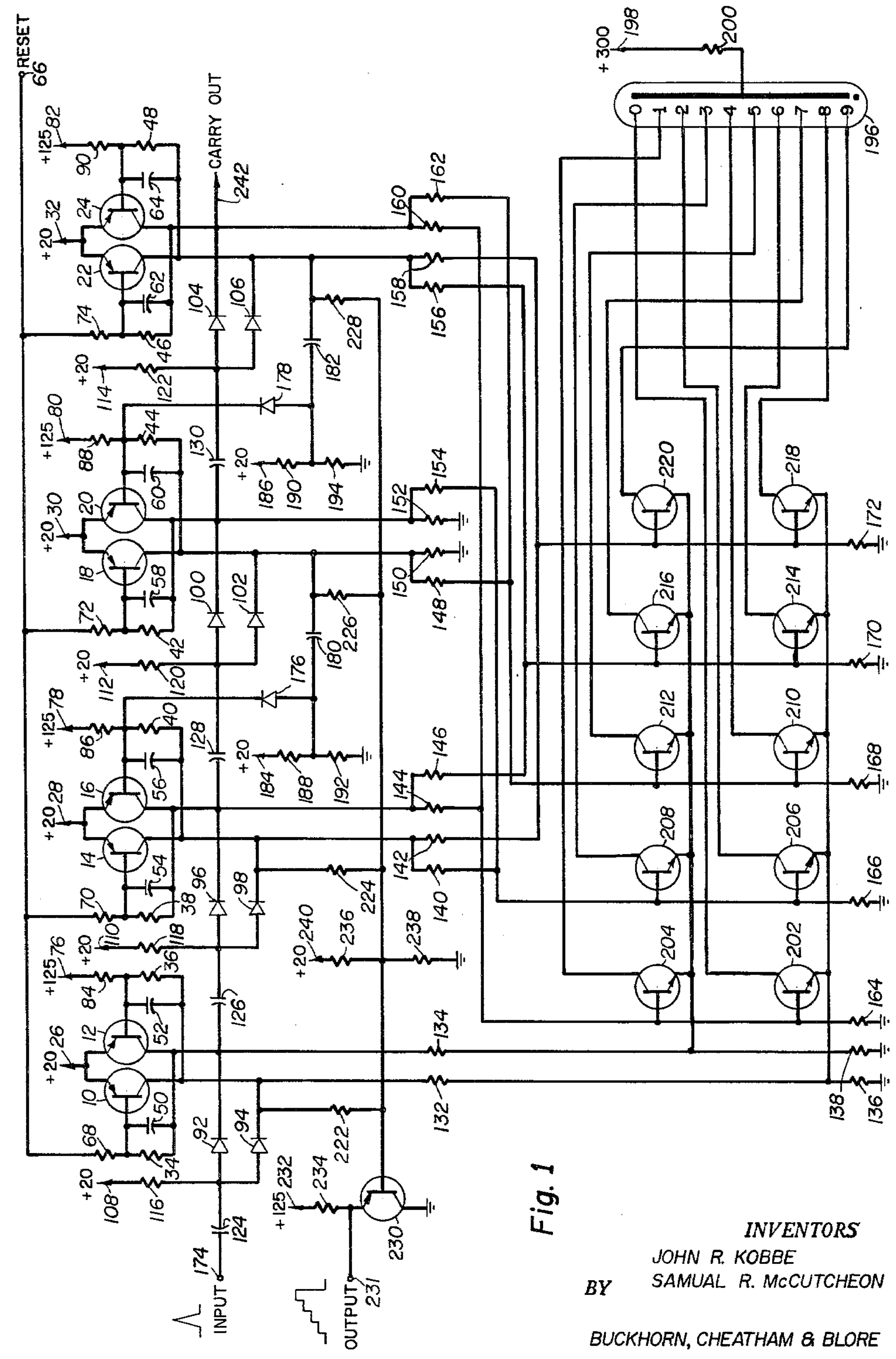

The subject matter of the present invention relates in general to a pulse counter and in particular to electrical switching circuits arranged as pulse counter and decimal read out circuits to determine the total number of electrical pulses supplied to such pulse counter.

The pulse counter of the present invention is particularly useful for supplying signals to indicator devices each having a separate electrode for each digit of each decade for displaying the number of pulses counted and will be described with reference to that specific embodiment. More specifically, the invention includes a plurality of bistable switching circuits connected to a plurality of decimal digit indicator circuits by means of a plurality of load impedances which are common to such bistable switching circuits and to such indicator circuits so that they perform the dual functions of load impedances and logic matrix elements. The result is that the pulse counter circuit of the present invention has fewer circuit elements and lower switching circuit impedance which allows simplified logic matrixing and the use of inexpensive transistors in the indicator circuits to drive the decimal display device.

The preferred embodiment of the present invention employs, for each decade, four stages of RC coupled bistable multivibrator counter circuits each having two transistors and having diode coupling to the inputs of the various stages to carry pulses forwardly to the successive stages. Such embodiment also employs diode feed back from the fourth to the third stage and from the third to the second stage in order to provide a binary-coded decade counter with the four stages thereof corresponding to numerical values of 1, 2, 2, 4, respectively. The load resistors of each transistor of the bistable multivibrator stages are connected as a logic matrix to selectively cause operation of ten different read out driver transistors each of which is connected to a different electrode of a decade read out display device, such as a glow tube having ten separate cathodes each in the form of a decimal digit. Each such driver transistor is controlled by a combination of three different load resistors and only one of such transistors has its collector circuit conducting at any one time.

Therefore, one object of the present invention is to provide an improved pulse counter circuit.

Another object of the present invention is to provide an improved electrical pulse counter circuit in which load impedances for binary counter switching elements also function as logic matrix impedances for a decimal read out.

A further object of the invention is to provide an improved binary counter circuit in which the load resistors of a plurality of bistable multivibrator counter stages are also used as logic matrix resistors for a plurality of read out indicator circuits providing a decimal read out.

Still another object of the present invention is to provide an improved binary-coded decade counter in which four counter stages are employed with each stage connected as an RC coupled bistable multivibrator, such stages being interconnected with feedback between certain stages to produce a decade pulse counter and in which different combinations of load resistors for the counter stages are connected to separate decimal read out circuits so that only one of such read out circuits will be energized at one time to display one digit of a decade.

Additional objects and advantages of the present invention will be apparent from the following detailed description of a preferred embodiment thereof shown in the attached drawings of which:

FIG. 1 shows a decade counter circuit in accordance with the preferred embodiment of the present invention.

The embodiment of the counter circuit of the present invention shown in FIG. 1 includes four counter stages, each of which is a bistable multivibrator or flip-flop switching circuit. Such stages are connected in cascade and the circuit has feedback connections between the second and third, and between the third and fourth stages to provide a decade counter in which the binary decimal code values of the stages from left to right in FIG. 1 are 1, 2, 3, and 4, respectively. Each of the four stages includes a similar RC coupled bistable multivibrator circuit, each of which contains two electrical signal translating devices shown as PNP transistors 10 and 12, 14 and 16, 18 and 20, 22 and 24 in the first, second, third and fourth stages, respectively. Such transistors operate as switching transistors and all have common emitter connections 26, 28, 30 and 32 to a source of positive D.C. emitter voltage with an RC coupling impedance connected from the base of each switching transistor to the collector of the other switching transistor in the same stage. Each coupling impedance contains a parallel combination of a resistor and a capacitor. Thus resistors 34, 36, 38, 40, 42, 44, 46 and 48 are connected in parallel with capacitors 50, 52, 54, 56, 58, 60, 62 and 64, respectively, in the different coupling circuits. The base of each of the counter transistors 10, 14, 18 and 22 in each of the four counter stages is connected to a common source of positive reset voltage 66 through biasing resistors 68, 70, 72 and 74, respectively. A positive reset voltage applied through a conductor 66 resets all of the stages to their zero digit initial operating condition with the collector circuit of each of the transistors 10, 14, 18 and 22 nonconducting. The other transistors 12, 16, 20 and 24 of each of the stages has its base electrode connected to a source of positive D.C. bias voltage through connectors 76, 78, 80 and 82, respectively, and biasing resistors 84, 86, 88 and 90, respectively. Each of the four counter stages also has a unidirectional conducting input circuit including a pair of back-to-back connected diodes 92 and 94, 96 and 98, 100 and 102, 104 and 106, respectively. Such diodes each have their cathode output terminals separately connected to the collector electrode of one of the switching transistors in each counter stage and have their common anode input terminal connected to a source of positive D.C. forward bias voltage through conductors 108, 110, 112, and 114, respectively, and biasing resistors 116, 118, 120 and 122, respectively. A coupling capacitor 124, 126, 128 and 130, respectively, is also connected to the common anode input terminal of each pair of diodes. The coupling capacitor 124 couples the counter circuit to the pulse input circuit more fully described below and the coupling capacitors 126, 128 and 130 couple the output of a preceding counter stage to the input of a succeeding counter stage.

The four counter stages are different in certain respects including the fact that the collectors of transistors 10 and 12 of the first stage are each connected to ground through a single load resistor 132 and 134, respectively, and a single emitter biasing resistor 136 and 138, respectively, while the remaining switching transistors 14, 16, 18, 20, 22, and 24 of the succeeding counter stages are each connected to one terminal of each of a pair of load resistors 140 and 142, 144 and 146, 148 and 150, 152 and 154, 156 and 158, 160 and 162, respectively. Each resistor of these pairs of load resistors has its other terminal connected to the other terminal of a resistor of another pair of load resistors and such common connection of such other terminals is connected to ground through a single bias resistor, with the exception of load resistors 150 and 152 of transistors 18 and 20 which have their other terminals connected directly to ground. Thus, load resistors 144 and 160 are connected to ground through a common base bias resistor 164, load resistors 140 and 154 are connected to ground through base bias resistor 166, load resistors 148 and 162 are connected to ground through bias resistor 168, load resistors 146 and 156 are connected to ground through base bias resistor 170, and finally, load resistors 142 and 158 are connected to ground through base bias resistor 172. The operation of this logic matrix connection of the load resistors will be explained later.

It should be noted that the pulse signal input terminal 174 for the counter circuit is through coupling capacitor 124, while the remaining coupling capacitors 126, 128 and 130 are connected between the collectors of transistors 12, 16 and 20, respectively, of a preceding counter stage and the input circuit of a succeeding stage. Also two feedback circuits are provided, one between the second and third stages, and the other between the third and fourth stages in order to reduce the count of the binary counter circuit from sixteen to ten so that a decimal read out may be obtained. Each of these feedback circuits includes a feedback diode 176 and 178, respectively, connected from the collector of the transistor 18 and 22, respectively, of the following stage to the base of the transistor 16 and 20, respectively of the preceding stage through a coupling capacitor 180 and 182, respectively, connected in series between the anode of such feedback diodes and such collector of such following transistor. Each of these feedback diodes is normally forwardly biased from a source of positive D.C. voltage through connectors 184 and 186 each connected to the cathode of a diode 176 and 178, respectively, through a bias resistor 188 and 190, respectively. Each of these bias resistors 188 and 190 forms a voltage divider with resistors 192 and 194, respectively, the latter resistors being connected to the ground.

The output of the decade counter is connected to a decimal read out display device 196 which may be, for example, an electro-mechanical counter, an electroluminescent indicator device, or a gaseous glow discharge counter tube having separate superimposed cathodes shaped as different decimal digits to give a visual indication of the total number of voltage pulses which have been counted. If a gaseous glow discharge tube display device is used, the anode of such device is connected to a source of positive D.C. bias voltage through a conductor 198 and a load resistor 200 while its cathodes are each connected, respectively, to the collector electrodes of ten different driver transistors. The emitter and base electrodes of each of such driver transistors are connected to different three-resistor combinations of the load resistors of the counter transistors so that only one of such driver transistors has its collector circuit conducting at one time to energize one of the digits of the glow tube 196. Thus, driver transistor 202 has its collector connected to the 0 digit of tube 196, its emitter connected to the bias resistor 136, and its base connected to bias resistor 164. Driver transistor 204 has its collector connected to the 1 digit, its emitter connected to bias resistor 138, and its base connected to the bias resistor 164. Driver transistor 206 has its collector connected to the 2 digit, its emitter connected to bias resistor 136, and its base connected to bias resistor 166. Driver transistor 208 has its collector connected to the 3 digit, its emitter connected to bias resistor 138, and its base connected to bias resistor 166. Driver transistor 210 has its collector connected to digit 4, its emitter connected to bias resistor 136, and its base connected to bias resistor 168. Driver transistor 212 has its collector connected to digit 5, its emitter connected to bias resistor 138, and its base connected to bias resistor 168. Driver transistor 214 has its collector connected to digit 6, its emitter connected to bias resistor 136, and its base connected to bias resistor 170. Driver transistor 216 has its collector connected to digit 7, its emitter connected to bias resistor 138, and its base connected to bias resistor 170. Driver transistor 218 has its collector connected to digit 8, its emitter connected to bias resistor 136, and its base connected to bias resistor 172. Driver transistor 220 has its collector connected to digit 9, its emitter connected to bias resistor 138, and its base connected to bias resistor 172.

A staircase analog read out voltage may also be obtained from the counter circuit in which each step represents a pulse counted by the counter circuit. Thus, an analog read out circuit may be provided including a plurality of current adding resistors 222, 224, 226 and 228 connected between the collectors of switching transistors 10, 14, 18 and 22, respectively, and the base of a PNP type analog read out transistor 230. The staircase voltage is obtained from the output terminal 231 connected to the emitter of the transistor 230. Such emitter is connected to a source of positive D.C. emitter voltage through a conductor 232 and a load resistor 234. The collector of such read out transistor 230 is grounded and its base is connected to the common terminal of a pair of voltage divider biasing resistors 236 and 238 which have their other terminals connected to a source of positive D.C. bias voltage and ground, respectively, the connection to such source being through a conductor 240. Thus, the transistor 230 is connected as an emitter follower so as to follow the voltage developed across the resistor 238.

The operation of the decade counter circuit of the present invention is as follows: In order to condition the counter for initial operation, a positive reset voltage is applied to the base of transistors 10, 14, 18 and 22 through the conductor 66 causing transistors to turn off if not previously turned off, i.e., have their collector circuits become nonconducting, due to the reverse bias between the emitter and base. This causes transistors 12, 16, 20 and 24 to turn on if not previously turned on, i.e., have their collector circuits become conducting, due to a negative pulse applied to the base of any of such last mentioned transistors from the collector of the other transistor of the same stage when such other transistor turned off.

Transistor 10 of the first counter stage is in its turned off condition as a result of the reset voltage, and the current through and the voltage drop across bias resistor 136 is zero or of low value thereby causing the even numbered digit driver transistors 202, 206, 210, 214 and 218 to be conditioned for being turned on, i.e., have their collector circuits conducting. At the same time the odd number digit driver transistors 204, 208, 212, 216 and 220 are prevented from being turned on since counter transistor 12 of the first counter stage is turned on and a positive voltage is developed across the bias resistor 138 and applied to the emitters of the odd number driver transistors.

In order to complete the turning on of any one of the even digit driver transistors, a positive voltage as a result of current flow through two load resistors associated with the remaining three counter stages must be applied to the base electrode of such transistor. To thus turn on the (0) digit driver transistor 202 such current must be from two of the counter transistors 16, 20 and 24 because only they have been turned on in the remaining three stages by the rest voltage so that current is increased through their respective load resistors. As shown in FIG. 1, the only two load resistors of the transistors 16, 20 and 24 having a common connection are resistors 144 and 160. The current through such load resistors flows through bias resistor 164 to increase the voltage drop across such bias resistor by the required amount to apply a sufficient forward bias voltage between the emitter and base of driver transistor 202 to cause transistor 202 to turn on and the (0) digit of the glow tube 196 to become visible. Since load resistors 144 and 160 are the only two load resistors having a common connection in which the current flow increases under the conditions described above, the (0) digit number is the only number which glows in the indicator device 196 following application of a positive reset voltage through conductor 66.

When the first positive voltage pulse to be counted is applied to the signal input 174, it is transmitted through the diode 94 since such diode is forward biased because of the off condition of transistor 10, but is not conducted through diode 92 because diode 92 is reverse biased due to the on condition of transistor 12. This positive signal pulse is applied directly to the collector of transistor 10 and to the base of transistor 12 through the RC coupling impedance provided by resistor 36 and capacitor 52 so that transistor 12 is turned off. Transistor 10 is turned on due to the negative pulse produced on the collector of transistor 12 when it is turned off being applied to the base of transistor 10. This negative pulse can not be transmitted through diodes 96 and 98 because of its polarity so that the remaining counter transistors in the second, third and fourth counter stages continue in the same condition as previously obtained by the reset voltage. However, the off condition of transistor 12 decreases the current flowing through load resistor 134 and bias resistor 138 so that the voltage drop across bias resistor 138 becomes less and thereby enables the odd-digit driver transistors 204, 208, 212, 216 and 220 to be conditioned for being turned on. Since the conditions of conduction of the counter transistors in the second, third and fourth stages remains unchanged, the voltage drop across bias resistor 164 also remains unchanged so that it causes driver transistor 204 to turn on and digit (1) to glow in tube 196. Also since the counter transistor 10 has turned on, the (0) driver transistor 202 turns off since its emitter has been driven in a positive direction due to the increased current flow through load resistor 132 and bias resistor 136.

The next input positive pulse is not transmitted through diode 94 which is now reversely biased since counter transistor 10 is turned on but is transmitted through diode 92 which is now forwardly biased since counter transistor 12 is turned off. Such pulse is applied directly to the collector of transistor 12 and to the base of transistor 10 through the capacitor 50 and resistor 34 so that transistor 10 turns off and transistor 12 turns on. This operation of transistors 10 and 12 continues with successive input pulses so that the odd digit driver transistors 204, 208, 212, 216 and 220 are conditioned for being turned on by an odd number of input pulses and the even digit driver transistors 202, 206, 210, 214 and 218 are conditioned for being turned on by an even number of input pulses.

The second input pulse causes the collector of counter transistor 212 to make a positive excursion and the resulting positive pulse is transmitted through diode 98 which is at that time forwardly biased since transistor 14 is turned off, but such pulse is not transmitted through diode 96 which is at that time reversely biased since transistor 16 is turned on. This causes transistor 14 to turn on and transistor 16 to turn off. The thrid input pulse similarly causes the transistor 16 to again turn on and the transistor 14 to turn off and the succeeding stages operate in the same manner except for the feedback connections including the capacitors 180 and 182 and diodes 176 and 178 referred to above. Except for such feedback connections the count would be sixteen before the circuit returned to the zero condition and the binary code values of the various stages would be 1, 2, 4 and 8, but such feedback connections reduce the count to ten with the various stages having the code values 1, 2, 2 and 4, respectively.

Referring to the feedback connection between the third and second stages, the transistors 14 and 20 of these stages are turned on an dtransistors 16 and 18 are turned off after the third input pulse has been counted. Upon arrival of the fourth input pulse transistor 16 turns on and the resulting positive pulse from its emitter causes transistor 18 to be turned on. The resulting positive pulse from the emitter of transistor 18 is transmitted back through the capacitor 180 and diode 176 to the base of transistor 16 to cause such transistor 16 to again turn off resulting in the transistor 14 turning on, thus putting the second stage back into the same conductive condition it was before the arrival of the fourth input pulse but changing the conductive condition of the third stage.

A similar feedback action occurs between the fourth and third stages through the capacitor 182 and diode 178 upon the arrival of the sixth pulse to be counted. The result is a total count of 10 to return the counter circuit to its zero condition. It is to be noted that the transistor 18 is first turned off at the count of six pulses and that the feedback from the fourth stage by causing transistor 20 to again turn off also causes transistor 18 to immediately again turn on to produce a positive excursion of its collector. Such positive excursion of such collector is not, however, fed back through the capacitor 180 and diode 176 and does not turn the transistor 16 off from the "on" condition initially established by such sixth pulse because such positive excursion of the collector of transistor 18 immediately follows a negative excursion of such collector due to the transistor 18 being first turned off at the count of the sixth pulse. The negative pulse produced by such negative excursion is not transmitted through the diode 176 because of its polarity and the time constant of the circuit including the resistor 192 is such that the capacitor voltage does not change appreciably between the negative and positive excursions of the collector of the transistor 18 just described. The voltage applied to the anode of the diode 176 thus merely goes negative and then returns to its previous value without transmitting any positive pulse through the diode 176.

It should also be noted that the collector of the transistor 24 makes a positive excursion only for the count of 10 pulses when the counter circuit shown returns to its original or zero condition. A positive pulse from such transistor can thus be delivered to a second entirely similar counter through a carry out conductor 242 and read out circuit so that as many decades as desired can be cascaded to give a count or decimal read out of any number of digits.

The following table shows the condition of the various counting transistorss following each pulse count:

| Counting Transistor | 10 | 12 | 14 | 16 | 18 | 20 | 22 | 24 |
|---|---|---|---|---|---|---|---|---|
| 0 (reset) | off | on | off | on | off | on | off | on. |
| 1 | on | off | off | on | off | on | off | on. |
| 2 | off | on | on | off | off | on | off | on. |
| 3 | on | off | on | off | off | on | off | on. |
| 4 | off | on | on | off | on | off | off | on. |
| 5 | on | off | on | off | on | off | off | on. |
| 6 | off | on | off | on | on | off | on | off. |
| 7 | on | off | off | on | on | off | on | off. |
| 8 | off | on | on | off | on | off | on | off. |
| 9 | on | off | on | off | on | off | on | off. |

It will be found that for each condition of the counter transistors corresponding to each pulse count given in the above table, one only of the read out driver transistors will be turned on. For example, for a pulse count of 7 counter transistor 12 is off and the emitter of transistor 216 is at its most negative potential since current flow through bias resistor 138 is at its minimum. This conditions transistor 216 for being turned on if the base is also driven in a positive direction. Also, counter transistors 16 and 22 are on so that current flows through load resistors 146 and 156 and the sum of this current flows through bias resistor 170 to carry the base of driver transistor 216 in a positive direction to turn on transistor 216. It will also be found that no other pair of load resistors for the counter transistors which are connected to counter transistors in the on condition, are also connected to supply current to a single bias resistor for the bases of the driver transistors so that no other driver resistor is turned on. A similar condition exists for each pulse count.

In the staircase analog read out circuit, the resistors 224 and 236 each have twice the value of resistance of resistor 228 and the resistor 222 has twice the value of resistance of each of resistors 224 and 236. This means that the turning on of transistor 10 will produce a predetermined unit increase of current through the resistor 238 to drive the base of the transistor 230 one voltage unit in a positive direction. Turning on either of transistors 14 or 18 will produce an increase of current through the resistor 238 equal to two of the units mentioned above and turning on the transistor 22 will produce an increase of 4 of such units because of the different resistance values of the resistors 222, 224, 226 and 228 referred to above. These units are additive. For example, with the 7 pulse count also referred to above, counter transistors 10, 18 and 22 are on and the sum of the current units through the resistors 222, 226 and 228 is seven. An output voltage of 7 voltage units is thus obtained from the emitter follower transistor 230 and from terminal 231 and a similar condition exists for each of the other pulse counts. The pulse counter and read out circuits above described are capable of operation with input pulse frequencies somewhat greater than one megacycle per second.

It should be understood that various changes may be made in the details of the preferred embodiment described herein which would be obvious to one having ordinary skill in the art. Therefore, it is not intended to limit the scope of the present invention to the preceding detailed description of one embodiment thereof, but the spirit and scope of the present invention should only be determined by the following claims.

We claim:

1. An electrical counter circuit comprising:

a plurality of pairs of semiconductor switching devices with each device having an emitting electrode, a collecting electrode and a control electrode connected so that each pair of devices forms a bistable counter stage;

a plurality of pairs of unilateral conducting devices which conduct current substantially in only one direction with each of said pairs of unilateral conducting devices having a common input terminal and separate output terminals, said unilateral conducting devices being connected to different ones of said pairs of switching devices so that said unilateral conducting devices function as gates to control the transmission of electrical signal pulses applied to one of said common input terminals through said switching devices;

a plurality of load impedances connected to each of said pairs of switching devices so that each switching device is provided with a separate load impedance;

a plurality of output semiconductor devices; and means for connecting each of said output devices to a different combination of said load impedances and to a different element of an indicator device for indicating the number of said signal pulses so that said load impedances also function as logic matrix impedances and enable each output device to register a different number on said indicator device and for reducing the coupling resistance between said counter stages and said output devices to increase the speed of operation of the circuit.

2. An electrical counter circuit comprising:

a plurality of pairs of switching transistors with each switching transistor having an emitting electrode, a collecting electrode and a control electrode connected so that each pair of switching transistors forms a bistable multivibrator counter stage;

a plurality of pairs of diodes which are biased to conduct current substantially of only one polarity with each of said pairs of diodes having a common input terminal and two separate output terminals connected to different ones of such switching transistors to function as gating diodes to control the transmission of voltage pulses through said switching transistors from a circuit input terminal;

a plurality of pairs of load resistance connected to each of said pairs of switching transistors so that each switching transistors is connected to a different load resistance;

an indicator device for indicating the total number of voltage pulses applied to said circuit input terminal within a selected limit;

a plurality of output transistors; and means connecting the emitter and base of each output transistor to a different combination of said load resistances and its collector to a different element of said indicator device so that said load resistances also function as logic matrix elements and enable each output transistor to register a different number on said indicator device and for reducing the coupling resistance between said counter stages and said output transistors to increase the speed of operation of the circuit.

3. An electrical counter circuit comprising:

a first pair of electrical signal translating devices each having an emitting electrode, a collecting electrode and a control electrode and said devices being connected together as a flip-flop type of counter stage, a first pair of unilateral conducting devices which are biased to conduct current substantially of only one polarity having a common input terminal and connected at their separate output terminals to said first pair of signal translating devices as gates to control the transmission of signal pulses applied to said input terminal to said first pair of signal translating devices;

a first pair of load impedances connected to each of said first pair of signal translating devices;

a second pair of electrical signal translating devices similar to said first pair of signal translating devices and with the devices of said second pair connected together in substantially the same manner;

a second pair of unilateral conducting devices similar to said first pair of unilateral conducting devices and connected to said second pair of signal translating devices in substantially the same manner as the connection between said first pair of unilateral conducting devices and said first pair of signal translating devices, with the common input terminal of said second pair of unilateral conducting devices connected to one of said first pair of signal translating devices;

a second pair of load impedances connected to each of said second pair of signal translating devices;

an indicator device for indicating the number of signal pulses applied to said input terminal of said first pair of unilateral conducting devices;

a plurality of semiconductor devices each connected to said indicator device; and means connecting each of said plurality of devices to a different impedance combination of said load impedances so that said load impedances also function as logic matrix impedances and enable each of the plurality of semiconductor devices to register a different number on said indicator device in response to one of said signal pulses and for reducing the coupling resistance between said counter stages and said switching devices to increase the speed of operation of the circuit.

4. An electrical pulse counter circuit comprising:

a plurality of switching pairs of transistors, connected as common emitter amplifiers with the base of one transistor connected to the collector of the other transistor in each of said pairs of switching transistors to form a plurality of bistable counter stages;

a plurality of pairs of diodes connected between said counter stages, each of said pairs of diodes having a common input terminal and two separate output terminals with the input terminal connected to one of the transistors of one of said counter stages and the output terminal of each diode of each of said pairs of diodes connected to a different one of the transistors in another of said counter stages;

a plurality of load resistors connected to said pairs of switching transistors so that each of said resistors is connected to a different one of said switching transistors;

a plurality of driver transistors, each adapted to be connected to an indicator device for indicating the number of pulses counted;

means connecting each driver transistor to a different combination of said load resistors so that said load resistors also function as logic matrix resistors for said indicator device and for reducing the coupling resistance between said counter stages and said driver transistors to increase the speed of operation of the circuit; and a plurality of at least some of said load resistors connected as bias resistors for the driver transistors in order to bias said driver transistors normally nonconducting.

5. An electrical pulse counter circuit comprising:

a plurality of switching pairs of transistors having a common emitter connection with the base of each transistor connected to the collector of the other transistor in each of said pairs of transistors through a coupling impedance to form a plurality of bistable multivibrator counter stages;

a plurality of pairs of steering diodes, each pair of diodes having a common input terminal and separate output terminals, with said common input terminal connected to the collector of a transistor in one of said counter stages and the output terminal of each diode of each of said pairs of diodes connected to the collector of a different one of the transistors in each of said pairs of switching transistors of another counter stage;

a plurality of pairs of load resistors connected to the collectors of said pairs of switching transistors so that each of said resistors is connected to the collector of a different one of said switching transistors;

an indicator device having a plurality of different shaped electrodes each corresponding to a different number for indicating the total number of voltage pulses applied to said input terminal of one of said pairs of diodes within a fixed interval;

a plurality of driver transistor;

means connecting each of said driver transistors to a different combination of said load resistors and to a different one of said electrodes of said indicator device so that said load resistors also function as logic matrix resistors for said driver transistors and for reducing the coupling resistance between said counter stages and said driver transistors to increase the speed of operation of the circuit; and means to apply a D.C. bias voltage to said pairs of switching transistors so that one of the transistors of each of these pairs of switching transistors is conducting while the other is nonconducting in each of said counter stages in such a manner as to allow only one of said driver transistors at a time to become conducting and energize one of said electrodes of said indicator device.

6. An electrical pulse counter circuit comprising:

a first pair of switching transistors having a common emitter connection with the base of each connected to the collector of the other of said pair of transistors through a coupling impedance to provide a flip-flop switching circuit forming a first binary counter stage;

a first pair of steering diodes having a common back-to-back connected input terminal and two separate output terminals with the output terminal of each of said diodes connected to the collector of a different one of said first pair of switching transistors;

a first pair of load resistors connected to said first pair of switching transistors so that each of said resistors is connected to the collector of a different one of said switching transistors;

a second pair of switching transistors connected to form a second binary counter stage in a similar manner to said first pair of switching transistors;

a second pair of steering diodes connected to said second pair of switching transistors similar to the manner in which said first pair of steering diodes is connected to said first pair of switching transistors and with the common input terminal of said second pair of steering diodes connected to the collector of one of said first pair of switching transistors;

a second pair of load resistors connected to said second pair of switching transistors so that each of said second pair of resistors is connected to the collector of a different one of said second pair of transistors;

a gaseous glow tube counter device having a plurality of electrodes shaped as different numbers for indicating the total number of voltage pulses applied to said input terminal of said first pair of diodes within the upper limit of said glow tube device;

a plurality of driver transistors, means for connecting the emitters of said driver transistors to one of said first pair of load resistors, their bases to one of said second pair of load resistors and their collectors to a different one of said electrodes of said glow tube device so that each of said driver transistors is connected to a different combination of said load resistors and said load resistors also function as logic matrix resistors for said glow tube device and for reducing the coupling resistance between said counter stages and said driver transistors to increase the speed of operation of the circuit; and means to apply D.C. supply voltage to said first and second pairs of switching transistors and said driver transistors so that one of the transistors of switching each of said pairs of transistors is conducting while the other is nonconducting to allow only one of said driver transistors at a time to become conducting and energize one of said electrodes of said glow tube device.

7. A decade pulse counter circuit comprising:

a first counter stage including a pair of transistors connected as switching transistors to form a bistable switch circuit, a pair of diodes having a common back-to-back connected input terminal and separate output terminals with the output terminal of each diode connected to a different one of said switching transistors so that said diodes are connected as steering diodes for said switching circuit, and two load resistors connected to said pair of switching transistors so that each of said resistors is connected to a different one of said switching transistors;

a second counter stage, similar to said first stage, but having the common input terminal of its steering diodes connected to one of the switching transistors of said first stage and a pair of load resistors in place of each of said two load resistors of said first stage;

a third counter stage, similar to said second stage, but connected at its diode input terminal to one of the switching transistors of said second stage and also having a feedback means connected from one of its switching transistors to said one switching transistor of said second stage;

a fourth counter stage, similar to said third stage, but connected by its diode input terminal to the other of the switching transistors of said third stage, and having its feedback means connected to said other switching transistor of said third stage;

a plurality of driver transistors;

means for connecting each of said driver transistors to a different resistor combination of said load resistors to allow only one of said driver transistors to conduct current at a time so that said load resistors are also connected as logic matrix elements and for reducing the coupling resistance between said counter stages and said driver transistors to increase the speed of operation of the circuit; and a decade indicator device connected to each of said driver transistors for indicating the number of pulses counted.

8. A decade pulse counter circuit comprising:

a first stage including a pair of transistors connecting as switching transistors to form a trigger switching circuit having a common emitter connection with the base of one connected to the collector of the other transistor of said pair of switching transistors, a pair of steering diodes having a common back-to-back connected input terminal and separate output terminals with the output terminal of each diode connected to the collector of a different one of said switching transistors, and two load resistors connected to the collector of said pair of switching transistors so that each of said resistors is connected to a different one of said switching transistors;

a second stage, similar to said first stage, but having the common input terminal of its steering diodes connected to the collector of one of the switching transistors of said first stage and a pair of load resistors connected in parallel in place of each of said two load resistors of said first stage;

a third stage, similar to said second stage, but connected by its diode input terminal to one of the switching transistors of said second stage and also having a feedback means connected from the collector of one of its switching transistors to the base of said one switching transistor of said second stage;

a fourth stage, similar to said third stage, but connected by its diode input terminal to the other of the switching transistors of said third stage, and having its feedback means connected to the base of said other switching transistor of said third stage;

ten driver transistors;

means for connecting each of said drive transistors to a different three-resistor combination of said load resistors so that each resistor of said combination is from a different counter stage to allow only one of said driver transistors to conduct at a time and said load resistors also function as logic matrix elements; and a decade display device having a separate electrode for each digit of the decade connected to the collector of a different one of each of said driver transistors to indicate the number of signal pulses counted.

9. A binary-coded decade counter circuit comprising:

a first stage including a pair of PNP type transistors connected as switching transistors to form a flip-flop switching circuit having a common emitter connection and the base of one conneced to the collector of the other of said pair of switching transistors through a coupling impedance, a pair of steering diodes having a common back-to-back connected input terminal and separate output terminals with the output terminal of each diode connected to the collector of a different one of said switching transistors, and two load resistors connected to the collector of said pair of switching transistors so that each of said resistors is connected to a different one of said switching transistors;

a second stage, similar to said first stage, but having the common input terminal of its steering diodes connected to the collector of one of the switching transistors of said first stage, and a pair of load resistors in place of said two load resistors of said first stage with one side of each of said pair of resistors connected in common and the other side to ground;

a third stage, similar to said second stage, but connected by its steering diode input terminal to one of the switching transistors of said second stage, and also having a feedback means including a feedback diode and a coupling capacitor connected from the collector of one its switching transistors to the base of said one switching transistor of said second stage;

a fourth stage, similar to said third stage, but connected by its steering diode input terminal to the other of the switching transistors of said third stage, and also having its feedback diode connected to the base of said other switching transistor of said third stage;

ten NPN-type driver transistors;

means for connecting each of said driver transistors to a different three-resistor combination of said load resistors in order that each resistor of said combination is in a different counter stage to allow only one of said driver transistors to conduct at a time so that said load resistors also serve as logic matrix elements;

a decade gaseous glow tube indicator device having an electrode for each digit of the decade connected to the collector of a different one of each of said driver transistors to indicate the number of signal pulses counted, and means to apply a bias voltage to said pairs of switching transistors and said driver transistors so that one of the transistors of each of these pairs of switching transistors is conducting while the other is nonconducting at a given time, in order to render only one of said driver transistors conducting at the same time, so that only one of said electrodes of indicator device is energized for each input voltage pulse applied to the input connection of said steering diodes of said first stage, due to the matrix action of said load resistors.

10. A pulse counter circuit, comprising:

a plurality of interconnected counter stages having separate load resistances;

an indicator means having a plurality of different display elements for indicating the number of pulses received by said counter circuit;

a plurality of semiconductor switching devices each having its output connected to a different one of the display elements of said indicator means; and devices for connecting each of said switching means to a different combination of said load resistances so that said load resistances form a logic matrix to cause a different one of said switching devices to actuate its corresponding display element for each successive input pulse received by the counter stages and for reducing the coupling resistance between said counter stages and said switching devices to increase the speed of operation of the circuits.

11. A pulse counter circuit, comprising:

a plurality of interconnected counter stages each of said stages being a bistable multivibrator having a plurality of separate load resistances;

a gas discharge type indicator tube having a plurality of electrodes shaped as different numbers;

a plurality of switching transistors each having its collector connected to a different one of the display electrodes of said indicator means; and means for connecting the emitter and base of each of said switching transistors to a different combination of said load resistances so that portions of said load resistances form a logic matrix to cause a different one of said switching transistors to actuate its corresponding display electrode for each successive input pulse received by the counter stages and for reducing the coupling resistance between said counter stages and said switching transistors to increase the speed of operation of the circuit.

References Cited by the Examiner

UNITED STATES PATENTS

| | | | |
|---|---|---|---|
| 2,763,432 | 9/1956 | York | 235—92 |
| 2,843,320 | 7/1958 | Chisholm | 235—92 |
| 2,869,000 | 1/1959 | Bruce | 235—92 |
| 2,906,906 | 9/1959 | McCanley et al. | 313—109.5 |
| 2,982,880 | 5/1961 | Klipstein | 235—92 |
| 3,028,507 | 4/1962 | Sacks | 307—88.5 |
| 3,038,658 | 6/1962 | Hempel | 235—92 |
| 3,045,127 | 7/1962 | Carey | 307—92.5 |
| 3,080,501 | 3/1963 | Charbonnier | 315—84.5 |

MALCOLM A. MORRISON, *Primary Examiner.*

UNITED STATES PATENT OFFICE
CERTIFICATE OF CORRECTION

Patent No. 3,219,801 November 23, 1965

John R. Kobbe et al.

It is hereby certified that error appears in the above numbered patent requiring correction and that the said Letters Patent should read as corrected below.

Column 2, line 14, for "1, 2, 3," read -- 1, 2, 2, --; column 4, line 64, for "rest" read -- reset --; column 5, line 72, for "an dtransistors" read -- and transistors --; column 8, line 7, for "resistance" read -- resistances --; line 9, for "transistors" read -- transistor --; same column 8, line 71, and column 9, line 28, for "switching pairs of", each occurrence, read -- pairs of switching --; column 9, line 53, for "transistor" read -- transistors --; column 10, lines 47 and 48, for "switching each of said pairs of" read -- each of said pairs of switching --; line 56, for "switch" read -- switching --; column 12, line 18, after "one" insert -- of --; column 12, line 60, for "devices for connecting each of said switching means" read -- means for connecting each of said switching devices --; column 14, line 10, for "307-92.5" read -- 307-82.5 --.

Signed and sealed this 27th day of September 1966.

(SEAL)
Attest:

ERNEST W. SWIDER
Attesting Officer

EDWARD J. BRENNER
Commissioner of Patents